United States Patent
Falter

(10) Patent No.: US 8,450,652 B2
(45) Date of Patent: May 28, 2013

(54) APPARATUS FOR THERMALLY TREATING SEMICONDUCTOR SUBSTRATES

(75) Inventors: Manfred Falter, Ulm (DE); Ernst Falter, legal representative, Ulm (DE); Jeanette Falter, legal representative, Stuttgart (DE)

(73) Assignee: Mattson Thermal Products GmbH, Dornstadt (DE)

( * ) Notice: Subject to any disclaimer, the term of this patent is extended or adjusted under 35 U.S.C. 154(b) by 1108 days.

(21) Appl. No.: 12/251,916

(22) Filed: Oct. 15, 2008

(65) Prior Publication Data

US 2009/0139977 A1    Jun. 4, 2009

Related U.S. Application Data

(60) Provisional application No. 61/017,818, filed on Dec. 31, 2007.

(30) Foreign Application Priority Data

Dec. 3, 2007    (DE) .................. 10 2007 058 002

(51) Int. Cl.
*H01L 21/26* (2006.01)
*H01L 21/324* (2006.01)
*F27B 5/14* (2006.01)
*F27D 11/00* (2006.01)
*C30B 33/02* (2006.01)

(52) U.S. Cl.
USPC ........... 219/405; 219/411; 392/411; 392/416; 392/422; 392/430

(58) Field of Classification Search
None
See application file for complete search history.

(56) References Cited

U.S. PATENT DOCUMENTS

| 4,560,420 A | 12/1985 | Lord |
| 4,818,327 A | 4/1989 | Davis et al. |
| 4,981,815 A | 1/1991 | Kakoschke |
| 5,399,523 A | 3/1995 | Kakoschke |
| 5,467,220 A | 11/1995 | Xu |

(Continued)

FOREIGN PATENT DOCUMENTS

| JP | 63200455 A | * | 8/1988 |
| JP | 63227014 | | 9/1988 |
| JP | 04354121 A | * | 12/1992 |
| JP | 2003282470 A | * | 10/2003 |

OTHER PUBLICATIONS

JP2003-282470A, Oct. 2003, Koyama, eta l, partial translation.*

(Continued)

*Primary Examiner* — Joseph M Pelham
(74) *Attorney, Agent, or Firm* — Dority & Manning, P.A.

(57) ABSTRACT

An apparatus for thermally treating semiconductor substrates has a processing space which is defined by first walls substantially parallel to the semiconductor substrate and a second side wall connected to the first walls; a substrate holding device disposed in the processing space which defines a substrate retaining region for a semiconductor substrate in the processing space; and heating elements which are disposed in the processing space between at least one of the first walls and the substrate retaining region. The thermal gradient between the edge of the semiconductor substrate and the center of the semiconductor substrate can be effectively compensated by providing a shutter between the substrate retaining region and the heating elements which limits the radiation emitted in the processing space by the heating elements in the direction of the substrate retaining region.

22 Claims, 2 Drawing Sheets

U.S. PATENT DOCUMENTS

| | | | |
|---|---|---|---|
| 5,856,652 A * | 1/1999 | Mayuzumi | 219/405 |
| 5,862,302 A * | 1/1999 | Okase | 392/416 |
| 5,991,508 A * | 11/1999 | Ohmine et al. | 392/418 |
| 6,034,356 A * | 3/2000 | Paranjpe | 219/390 |
| 6,082,213 A | 7/2000 | Skogward | |
| 6,127,658 A | 10/2000 | Kohav | |
| 6,709,267 B1 | 3/2004 | Hawkins et al. | |
| 6,717,158 B1 | 4/2004 | Gat et al. | |
| 7,043,148 B1 | 5/2006 | Powell | |
| 7,169,717 B2 | 1/2007 | Merkl et al. | |
| 7,184,657 B1 | 2/2007 | Camm et al. | |
| 7,317,870 B2 * | 1/2008 | Timans et al. | 392/416 |
| 8,000,587 B2 * | 8/2011 | Timans et al. | 392/411 |
| 2001/0035131 A1 | 11/2001 | Sakuma et al. | |
| 2003/0089698 A1 * | 5/2003 | Ratliff et al. | 219/390 |
| 2003/0200931 A1 * | 10/2003 | Goodwin | 118/725 |
| 2004/0169032 A1 * | 9/2004 | Murayama et al. | 219/411 |
| 2005/0098553 A1 | 5/2005 | Devine et al. | |
| 2007/0104470 A1 * | 5/2007 | Aderhold et al. | 392/422 |
| 2008/0069550 A1 * | 3/2008 | Timans et al. | 392/411 |
| 2008/0190909 A1 * | 8/2008 | Yokouchi | 219/385 |
| 2009/0245761 A1 * | 10/2009 | Nakajima | 392/416 |

OTHER PUBLICATIONS

PCT International Search Report for PCT/IB2008/054652 dated May 4, 2009.

* cited by examiner

APPARATUS FOR THERMALLY TREATING SEMICONDUCTOR SUBSTRATES

PRIORITY CLAIM

This application claims the benefit of priority of previously filed provisional application with the same title and inventors as present, having U.S. Provisional Patent Application Ser. No. 61/017,818 filed Dec. 31, 2007 which is incorporated herein by reference for all purposes. This application further claims the benefit of priority of previously filed German patent application no. 10 2007 058 002.0 filed Dec. 3, 2007 which is incorporated herein by reference for all purposes.

FIELD

The present invention relates to an apparatus for thermally treating semiconductor substrates. The apparatus has a processing space defined by first walls substantially parallel to the semiconductor substrate and at least one second wall connected to the first walls, a substrate holding device disposed in the processing space which defines a substrate retaining region for a semiconductor substrate in the processing space, and heating elements which are disposed in the processing space between at least one of the first walls and the substrate retaining region.

BACKGROUND

Rapid heating installations, so-called RTP systems for thermally treating semiconductor wafers are known for semiconductor production. Examples of these installations are described in U.S. Pat. Nos. 5,359,693 and 5,580,830.

In rapid heating installations, semiconductor substrates are subjected to thermal processes in different process gas atmospheres in order to achieve predetermined treatment results. The processing chamber often has a cuboid form in order to ensure even heating of the semiconductor substrates in accordance with the symmetry of the chamber while using bar-shaped heating elements, whereas the objects to be heated are mostly disc-shaped and round, mostly semiconductor wafers, preferably made of silicon, germanium, SiGe, SiC, GaAs or InP.

Thermal processes in rapid heating installations are mostly single disc processes which are generally characterised by rapid heating and cooling procedures. The temperature of the semiconductor wafer should be the same over the whole semiconductor surface at all times during the thermal process. In order to obtain the desired process results, RTP systems must therefore heat up a semiconductor wafer according to a pre-specified temperature/time curve, keep it at a specific temperature for a predetermined period of time (steady state phase), and finally cool it down again according to a temperature/time curve which is often also specified. Spike applications (rapid annealing processes) require particularly rapid heating and cooling procedures. The wafer must be brought to the process temperature (600-1200° C.) within a few seconds and be cooled down again.

With such processes the problem arises that the wafer is heated inhomogeneously during the heating phase during which it is irradiated with very high intensity. This is caused by single and multiple reflections of the primary radiation (radiation which is emitted by the heating elements, mostly halogen and/or arc lamps) on the highly reflective chamber walls which surround the wafer. This causes the effective radiation density of the primary radiation on the edge of the semiconductor disc edge to be greater than in the center of the disc because unlike the reflecting chamber, the center of the semiconductor disc absorbs a much greater part of the radiation than the chamber walls. Consequently the edge of the semiconductor substrate is heated more strongly than the center. The momentary temperature difference between the edge of the wafer and the center of the wafer can easily be 40 degrees Celsius or more.

If the wafer has finally reached its desired temperature, and if it is to be kept at a temperature or cooled down again, the heating elements are correspondingly adjusted so that the radiation of the heated wafer dominates with respect to the primary radiation of the heating elements. During cooling, the lamps are often even totally switched off. Now the opposite effect occurs: due to the radiation of the wafer over its surface, the edge of the wafer cools more rapidly than the center of the wafer. This is because the side chamber limit is further away from the edge of the wafer than the reflectors which reflect the radiation emitted by the center of the disc back to the wafer. As a result, the thermal energy radiated from the outer zones of the wafer close to the wafer edge generally hit the wafer statistically mostly at a flat angle after multiple reflections and dispersion on the reflector walls which are further away. With each reflection energy is lost by absorption on the reflector. In contrast, the radiation of the center of the wafer is reflected directly back onto the center of the wafer by reflectors disposed above and below the semiconductor substrate. The edge regions of the wafer are therefore heated less by the reflected wafer radiation than the center of the wafer when the wafer radiation dominates with respect to the lamp radiation. Furthermore, the surface of the wafer has on its side edge an additional edge surface which also radiates thermal energy. This thermal energy has a low probability of being reflected back to this edge surface after multiple reflections. Consequently the edge of the wafer is now colder than the center of the wafer. Therefore, the temperature/time curve on the edge of the semiconductor disc differs from the temperature/time curve of the center of the semiconductor disc due to these dynamic characteristics.

This problem can be compensated by different means. Early approaches (see e.g. U.S. Pat. No. 5,399,523) provide a processing chamber which is defined by a rhomboid reflector chamber arrangement extending around the processing chamber, the acute angles of which lie above and below the center of the wafer. The processing chamber may also be defined by a cuboid reflector chamber arrangement in which the heating elements and the upper and lower reflectors are disposed a very long way away from the wafer. These embodiments lead to a voluminous reflector chamber arrangement which is not practical in view of space and energy considerations. It has also been proposed to make the chamber walls absorbent so that reflection of the radiation back to the wafer is avoided. However, this requires a much higher radiant power to be emitted by the heating elements which, depending on the process temperature of the wafer, is twice to three times the power required with a reflective chamber arrangement. Consequently, the life of the heating elements is significantly reduced.

In many cases, a ring made of the same semiconductor material as the wafer is placed around the wafer. The ring is spaced only a few millimeters from the wafer. The effect of this is that when heated, the overall semiconductor surface irradiated with the heating elements is artificially enlarged. When using the ring, less additional lamp radiation reflected directly on the chamber walls hits the edge of the wafer and thus a smaller temperature gradient forms between the edge of the wafer and the center of the wafer. On the other hand, this also has an advantageous effect in the steady state and when cooling the wafer because when the lamps are switched off, the ring can emit part of its thermal radiation effectively towards the edge of the wafer material. A disadvantage of this apparatus is that it must be realized using relatively complex mechanical means. The ring for example requires additional support surfaces in the rapid heating system. A further disadvantage occurs predominantly with large wafers (currently 12 inches). When thermally treating such wafers, individual ring segments have to be placed around the wafer because whole wafer rings of the required size are not available industrially, and this further increases the mechanical complexity of the system. Another disadvantage of this apparatus is that the thermal and optical properties of the ring can change over time because, unlike the wafer, it remains in the furnace after the process. This may lead to changes in the thermal homogeneity between the edge of the wafer and the center of the wafer during the thermal treatment thereof, and this can lead to a change in the process results.

Another approach attempts to solve the problem by the heating elements being controlled differently. In this way the thermal gradient between the center of the wafer and the edge of the wafer can be reduced by heating the regions at the edge of the wafer less strongly than the center of the wafer during a heating-up phase, and by heating the edge regions more strongly than the center of the wafer during a steady state phase. This can be achieved, for example by using radiating elements (e.g. spot lamps or rod lamps) above and/or below the wafer which are controlled differently at the edge of the wafer than at the center of the wafer. For reasons of symmetry, when using rod lamps, the wafer must be rotated during the process. An arrangement of rod lamps above and below the wafer with optional additional rod lamps on the side walls of the chamber can, for example, be split into several groups of lamps, one portion of which irradiates the center of the wafer and another portion irradiating the edge regions of the wafer. The additional use of a wafer ring for further reducing the thermal gradient is also conceivable.

Currently the problem of thermal gradient forming between the edge of the wafer and the center of the wafer is solved by a combination of a wafer ring, rotation of the wafer and group control of the (rod-shaped) heating elements. This is technically complex and its use in practice shows that during the steady state phase of a process, with thermal processes which require high temperatures of over 1000 degrees Celsius, the outer lamps must often be operated at their maximum output, whereas the inner banks of lights disposed more above and/or below the center of the wafer contribute to the thermal process with less than half the maximum lamp output in order to compensate for the thermal gradient. This leads to more difficult temperature control. With rapid dynamic processes which only last a few seconds in association with rod-shaped heating elements, the problem occurs that the semiconductor substrate cannot be rotated quickly enough in order to guarantee the required thermal homogeneity over the semiconductor disc during all of the phases of the thermal process.

SUMMARY

It is therefore an object of the present invention to provide a thermal processing chamber for semiconductor substrates, in particular semiconductor wafers, which effectively compensates the thermal gradient occurring in rapid heating systems between the edge of the semiconductor substrate and the center of the semiconductor substrate with simple technical means. Additional objects and advantages of the invention will be set forth in the following description, or may be apparent from the description, or may be learned through practice of the invention.

A summary of exemplary embodiments and methods of the present invention will be set forth here. Using the description provided herein, one skilled in the art will understand that additional exemplary embodiments and methods are within the scope of the present invention.

One exemplary embodiment of the present invention provides at least one cover element or shutter between the substrate retaining region and the heating elements. The shutter limits the radiation emitted in the processing space by the heating elements in the direction of the substrate retaining region. By limiting the radiation which is directed towards the substrate retaining region and thus towards the semiconductor substrate, especially in a transverse direction, it is possible to set the radiation intensity easily such that an even heating of the semiconductor substrate is achieved.

In a preferred embodiment, the shutter may be fixed to at least one of the second walls so that the shutter projects into the processing space and thus forms a shutter opening with which the radiation falling onto the semiconductor substrate is limited.

According to another embodiment of the invention, a shutter may be provided not only on one side of the substrate retaining region and thus of the semiconductor substrate to be heated, but also on the opposite side so that the radiation is also correspondingly limited on the other side of the semiconductor substrate. This is particularly advantageous if heating elements for heating the semiconductor substrate are provided on both sides. The shutter preferably has a round shutter opening. According to one particular embodiment the shutter may be shaped such that the edge of the shutter opening corresponds to the outer contour of the disc-shaped semiconductor substrate or is similar and/or concentric thereto.

According to a further embodiment of the present invention, the shutter has on its side facing the substrate retaining region a reflective surface so that part of the radiation emitted from the outer region of the semiconductor substrate is reflected back onto the outer region thereof. This is particularly advantageous in the cooling phase because one can counter the tendency for the edge regions of the semiconductor substrate to cool down more quickly than the central region of the substrate. By the reflective surface, radiation emitted by the semiconductor substrate is reflected back in particular onto the outer region of the substrate so that the outer region of the substrate cools down less quickly and ideally in the same way as the central region of the substrate.

In another preferred embodiment, the shutter may be impermeable to the radiation emitted by the heating elements. According to yet another embodiment of the present invention, the shutter may be disposed in the radiation path between the heating elements and the substrate retaining region such that one or more wall sections on the at least one second wall between the substrate retaining region and the shutter is or are is at least partially shielded from direct radiation of the heating elements passing the shutter in the direction of the substrate retaining region. In this manner, the tendency for the outer regions of the substrate to heat up too quickly in comparison to the central region is countered. In still a further embodiment of the invention, at least one of the shutters may be arranged and/or designed such that between the shutter and the substrate retaining region, a circumferential processing region between the second wall and the substrate retaining region is formed. This processing region cannot be reached by direct radiation from the heating elements.

In still another embodiment of the present invention, the wall section or the surface facing towards the processing space is made of a reflective material or is coated with such a material. In this way cooling is slowed down during the cooling phase in the central region of the substrate because the radiation emitted by the substrate and in particular the edge regions thereof is partially reflected back by the reflective material onto the edge region of the substrate. Preferably the shutter opening is chosen such that the radiation passing through the latter, emitted by the heating elements, hits a semiconductor substrate disposed in the retaining region of the substrate, and only the radiation reflected thereon and/or transmitted therethrough hits the chamber walls and is reflected. According to a further embodiment of the invention, the shutter has a circumferential reflective region on its side facing towards the substrate retaining region. This in turn again reduces the cooling of the edge regions during the cooling phase since the reflective edge region of the shutter reflects radiation back onto the edge region of the substrate and thus the cooling of the edge region is slowed down. Preferably, the circumferential reflective region of the shutter generates diffuse reflection for optical radiation with wavelengths of between 500 nm and 3000 nm. In one embodiment of the present invention, the inner walls of the processing space are provided at least on portions of their surfaces with a metallic, reflective layer or are made of metallic, reflective materials which diffusely reflect optical radiation with wavelengths of between 500 nm and 3000 nm. The energy required for heating a substrate and/or the time required for the heating procedure can be reduced in this manner.

In still another preferred embodiment, the shutter is made of aluminum which offers good reflection in the specified wavelength range. A further embodiment of the present invention includes the provision of surface elements on the surface of the shutter facing the substrate retaining region along its circumference to create different distances between the shutter and the substrate retaining region. In this way it is possible to create reflective regions which differ locally and correspondingly to allow locally different heating and cooling characteristics. Moreover, effects of a door opening disposed in the side wall through which the processing chamber can be loaded or unloaded are compensated.

The heating elements may be halogen lamps and/or arc lamps, the latter being for example rod lamps the longitudinal axes of which are disposed substantially parallel to the inner surface of at least one of the first walls. These heating elements may be disposed above and/or below the substrate retaining region. The substrate holding device may also be rotatable in the processing space in order to allow even heating and cooling.

The wall section may at least partially surround the substrate retaining region in a circular manner, at least in parts. A further embodiment includes the wall section surrounding the substrate retaining region and having a cross-sectional surface, the outer limit of which corresponds to the outer limit of the semiconductor substrate. In this manner, even heating and cooling is achieved in the edge region of the substrate. This advantage can also be achieved or further improved by an embodiment of the invention in which the distance between the semiconductor substrate and the wall section is at least 70% and at most 130% of the distance between the semiconductor substrate and the first wall.

In still another embodiment of the present invention, the distance between the shutter and the substrate retaining region is adjustable. Adjustment of the shutter opening, for example by means of a movable shutter edge, is very advantageous if the radii or dimensions of the semiconductor substrates to be treated are different, or if different heating and cooling of the substrates over the substrate surface is desired.

In still a further embodiment of the present invention, the shutter may have a cooling system in order to prevent excessive heating of the aperture during irradiation by the heating elements. Furthermore, it may be advantageous to place a quartz plate between the substrate retaining region and the heating elements in the processing space. The sides of the first walls facing the processing chamber may also preferably have at least one absorbent and/or at least one further reflective surface.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE DRAWINGS

Definitions

A surface is described as being "reflective" if it reflects at least 70% of the radiation impinging thereon.

A surface is described as being "highly reflective" if it reflects at least 90% of the radiation impinging thereon.

A surface is described as being "absorbent" if it reflects at most 30% of the radiation impinging thereon.

A surface is described as being "diffusely reflective" if it reflects the radiation impinging thereon and having wavelengths of less than 3 pm, in a dispersed manner.

An axis/plane/surface is described as being "substantially parallel" to another axis/plane/surface if it forms an angle of intersection of less than 8 degrees with the other axis/plane/surface.

The "outer region" of a semiconductor substrate is to be understood as meaning that part of a semiconductor substrate which is located outside of a line running parallel to the edge of the substrate, the line being evenly distanced to the edge of the substrate and the position of which is determined such that the region enclosed by the line (the "central region" of the semiconductor substrate) and the region of the semiconductor substrate excluded by the line have approximately the same surface size.

DETAILED DESCRIPTION

Figure 1:
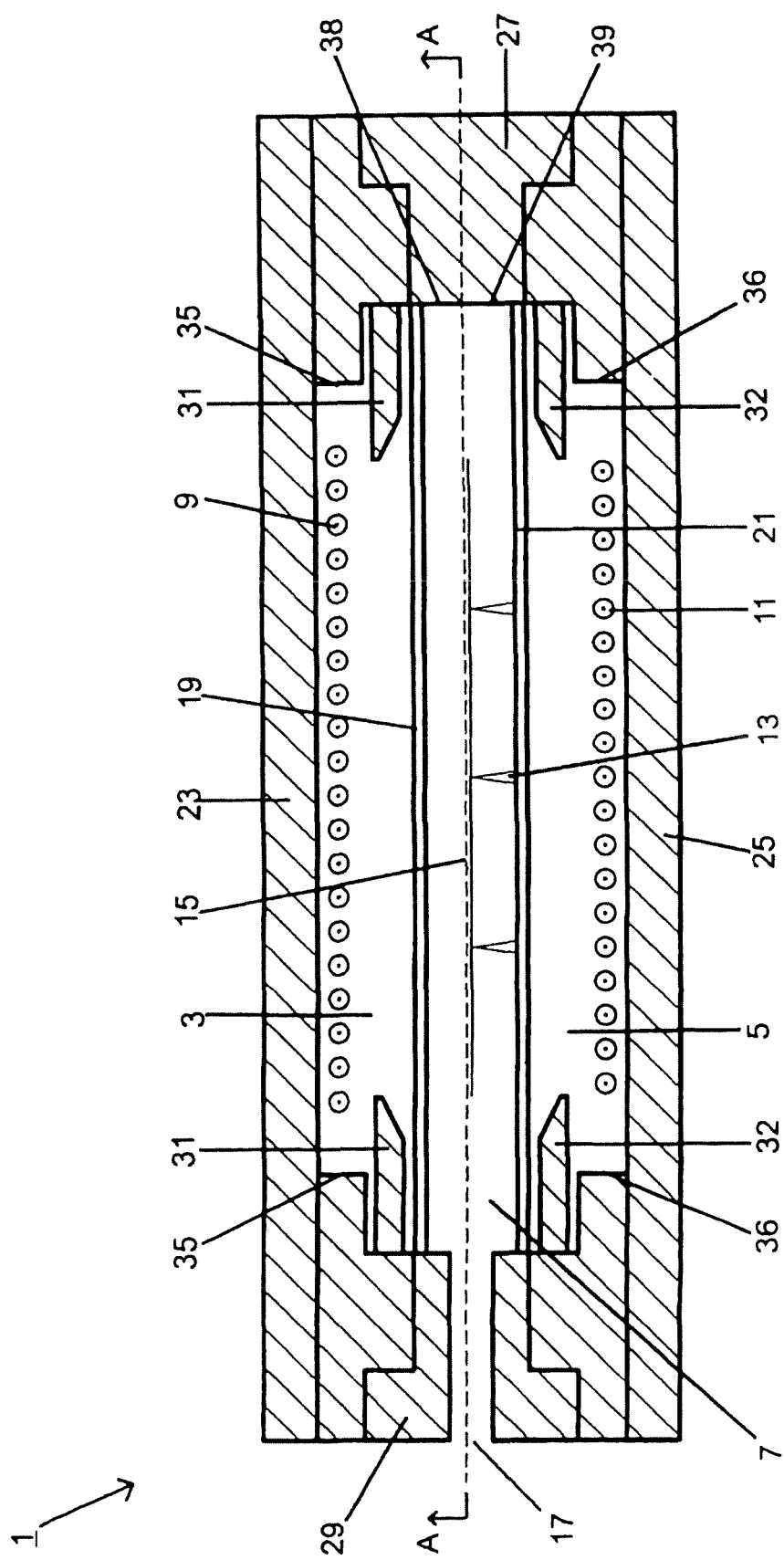
FIG. 1 shows a cross-section of a thermal processing chamber for the rapid thermal treatment of semiconductor substrates according to an exemplary embodiment the present invention.

FIG. 1 shows a cross-section of a processing chamber 1 of a rapid heating system for thermally treating semiconductor wafers. Located within the processing chamber 1 is the processing space 3, 5, 7 comprising an upper lamp chamber 3, a lower lamp chamber 5 and a reaction chamber 7. The upper and the lower lamp chambers each have a row of heating elements 9, 11, which are preferably rod-shaped, but can also be in the form of spot lights or surface radiation elements. The heating elements are preferably halogen lamps and/or arc lamps.

The reaction chamber 7 has a substrate holding device 13 which defines a substrate retaining region 15 for receiving a disc-shaped semiconductor substrate, such as for example a silicon wafer, which may be inserted through a door opening 17. Gas inlets and gas outlets (not shown) may be disposed in the reaction chamber by means of which a process gas can be conveyed to the semiconductor substrate. The upper and the lower lamp chambers can be separated from the reaction chamber 7 by transparent elements 19, 21, made for example of quartz glass or sapphire arranged in the processing chamber 1. The transparent elements can have regions which are opaque so that light passing through them is dispersed, and they can also have regions where the radiation passing therethrough is not dispersed.

The height of the processing space is limited by first walls 23, 25, for example an upper lamp plate 23 and a lower lamp plate 25. To the side the processing space is limited by second walls (side walls) 27, 29. The side wall 29 having the opening 17 for loading and unloading the reaction chamber. The first and second walls can have regions on their surfaces facing the processing space 3, 5, 7 which are absorbent, as well as regions which are reflective, wherein the reflective regions may have portions which are highly reflective. The reflective surfaces can be designed such that they show diffuse reflection or non-diffuse reflections. The walls are cooled, preferably with a liquid such as water. They are made of metal, such as stainless steel, copper, copper beryllium, aluminum or brass, and can have reflective surfaces preferably of gold or aluminum. However, they can also be provided with a ceramic or non-metallic coating.

Radiation blocking elements having an aperture, referred to as shutters 31, 32 herein, are located in the processing space, preferably in thermal contact with the side walls 27, 29 and/or fixed to the latter mechanically. The shutters 31, 32 are preferably disposed between the heating elements 9, 11 and the transparent elements or regions 13, 15. The shutters 31, 32 can alternatively be disposed in the reaction chamber 7 between the transparent elements 19, 21 and the substrate retaining region 15. The shutters are preferably made of a metal, such as for example aluminum, and can be provided with a cooling system, for example a water cooling system. The shutters may have a chamfer facing the substrate retaining region. Portions of the shutters, preferably circumferential portions of the surfaces of the shutters facing the substrate retaining region, are designed to be reflective, in particular highly reflective and/or diffusely reflective. The shutter opening is preferably of the same shape as the semiconductor substrate to be processed. For example, the shutter opening can be circular if disc-shaped, round semiconductor substrates are being processed. The shutter opening can be rectangular for rectangular semiconductor substrates, and square shaped for square semiconductor substrates. Advantageously the outer limit lines of the semiconductor substrate and the contour of the shutter opening are substantially parallel to one another. The shutter opening can be designed to be adjustable during processing of the semiconductor substrate.

The distance between the shutter and the substrate retaining region can also be adjustable, and in particular it can also be designed to be adjustable during a thermal process in order to obtain a thermal process individually adapted to the semiconductor substrate to be treated. Wafers can for example have optical properties in their outer edge regions different to those in the central regions. For example, structured semiconductor wafers often have a higher reflectivity for optical radiation in the edge regions, in which there are no chip structures, than in the other regions. Consequently, the outer edge is heated less strongly when using homogeneous radiation than the other regions of the semiconductor substrate. This leads to a temperature gradient between the edge of the wafer and the center of the wafer. This type of gradient can be compensated by using a shutter which is movable with respect to its distance to the substrate retaining region. By moving the shutter towards the semiconductor substrate, focusing of the reflection of the energy radiated by the edge of the semiconductor substrate onto a more sharply defined edge region of the semiconductor substrate may be achieved.

The inwardly facing surfaces of the side walls 27, 29 have regions 35, 36 which are disposed between first walls 23, 25 and shutters 31, 32. The inwardly facing surfaces of the side walls 27, 29 also have wall sections 38, 39 which are disposed between the shutters and the substrate retaining region. The wall sections 38, 39 do not necessarily have to include the whole height of the side wall section between the shutter and the substrate retaining region. The wall sections 38, 39 can have a circular or a partially circular cross-section if for example round semiconductor substrates are to be treated.

In the wall sections 38, 39, the side walls can be cylindrical or have an outward curve in the regions around the semiconductor substrate along their surfaces at right angles to the cross-section. However, the wall sections 38, 39 preferably have a cross-sectional surface around the semiconductor substrate which is similar to the surface of the disc-shaped semiconductor substrate. The semiconductor substrate is advantageously disposed within the substrate retaining region 15 of the reaction chamber 7 such that the contours of the semiconductor substrate and the wall sections 38, 39 of the surfaces of the side walls 27, 28 are substantially parallel to one another, and are disposed at ½, 1½, and/or approximately the same distance away from the semiconductor substrate as the first walls. Preferably, the first and second walls are provided with similar reflective properties in those regions which are disposed in a direct field of vision of the semiconductor substrate.

Figure 2A:
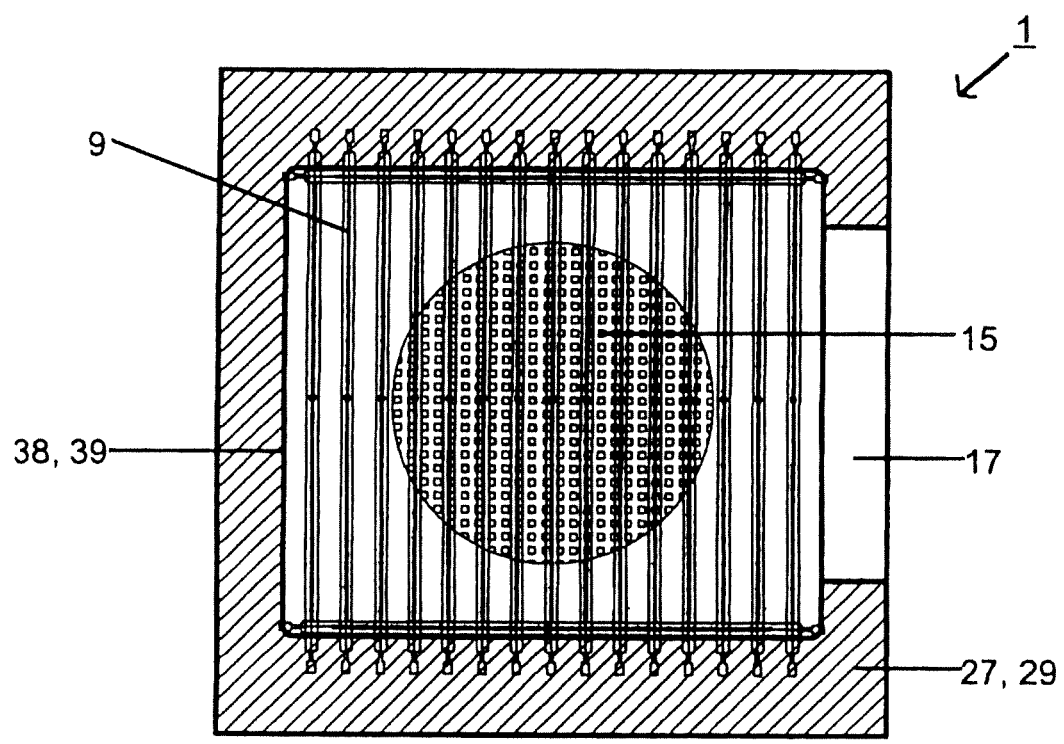
FIG. 2a shows a cross-sectional top view of a conventional thermal processing chamber through the upper lamp arrangement of an exemplary embodiment of the present invention.

FIG. 2a shows a cross-section of a conventional thermal processing chamber at the level of the substrate retaining region. The heating elements 9 lying above this region are shown diagrammatically in order to mark their position above the semiconductor substrate. The disc-shaped semiconductor substrate is disposed in the substrate retaining region 15 of the reaction chamber 7. The side walls 27, 29 are disposed around the semiconductor substrate with inwardly facing side wall sections 38, 39 positioned around the substrate retaining region 15 at right angles to one another. The semiconductor substrate can be inserted into the reaction chamber 7 and removed from the latter by means of the door opening 17 in the side wall 29.

Figure 2B:
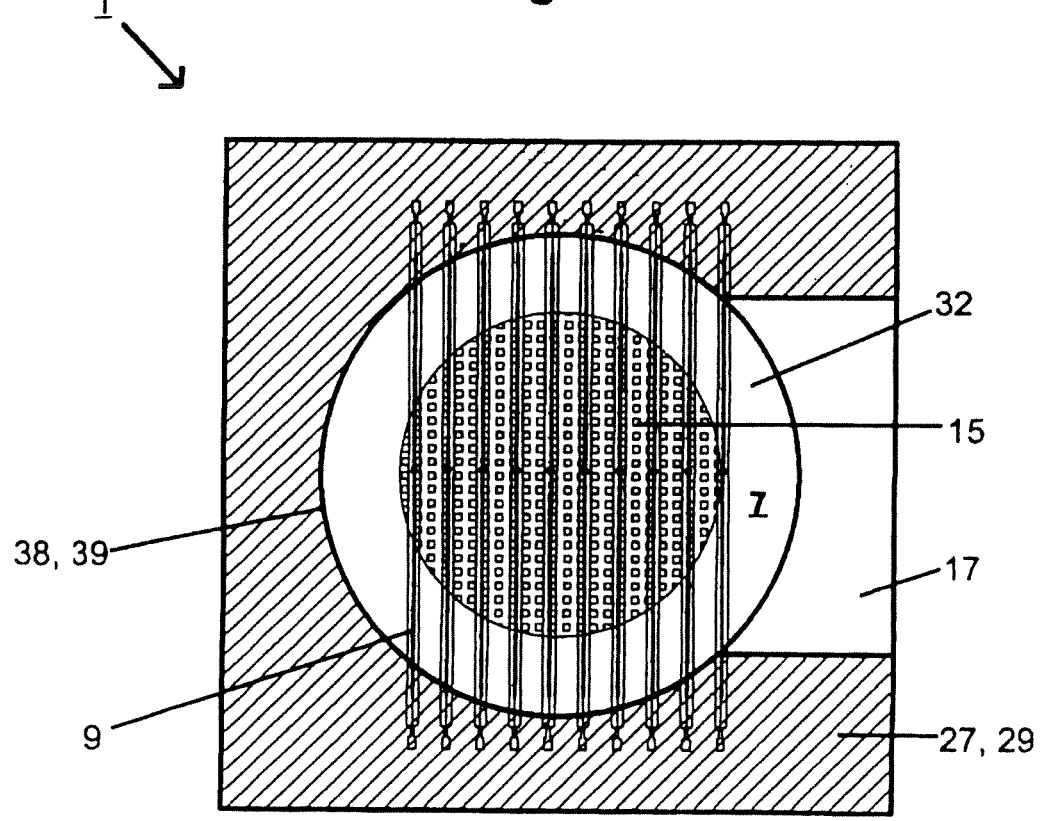
FIG. 2b shows a cross-sectional top view of the thermal processing chamber of FIG. 1 along line A-A.

FIG. 2b shows a cross-sectional view of the embodiment according to the invention of the thermal processing chamber of FIG. 1 along line A-A. The heating elements 9 are located above the sectional line and are shown diagrammatically in order to mark their position above the semiconductor substrate. The semiconductor substrate can be heated with a smaller number of heating elements than in the embodiment shown in FIG. 2b.

The disc-shaped semiconductor substrate is disposed in the substrate retaining region 15 of the reaction chamber 7 and is encompassed by a side wall 27, 29 having a circular cross-section extending around the substrate, the curvature of which is only interrupted by the door opening 17. The lower shutter 32, which is arranged beneath the substrate retaining region and shown diagrammatically in FIG. 2b is connected to the side wall 27, 29.

The mode of operation of an exemplary embodiment of the present invention will be discussed in detail below. After a disc-shaped semiconductor substrate (wafer) has been placed through the door opening 17 in the substrate retaining region 15, the door opening is closed. The wafer is now heated up by the heating elements 9, 11. The direct radiation of the heating elements in the direction of the side wall sections 38, 39 is limited by the shutters 31, 32 so that the radiation emitted directly onto the side wall sections 38, 39 is greatly reduced. Thus, the proportion of the radiation which is emitted by the heating elements and reflected on the side wall surfaces 38, 39 towards the edge of the wafer is very small, and consequently during the heating phase the edge of the wafer receives approximately the same radiation energy as the center of the wafer, and thus, has approximately the same temperature at the edge as in the center of the wafer during the heating phase. Therefore, the undesired effect of a wafer edge which is hotter than the wafer center during heating procedures can be avoided.

During the steady state and the subsequent cooling phase of the semiconductor substrate, the heating elements are adjusted or fully switched off so that the thermal radiation of the semiconductor substrate dominates with respect to the radiation of the heating elements. Consequently, the thermal radiation of the heated semiconductor substrate which is radiated by the edges of the semiconductor substrate towards the side wall sections 39, 30 and towards the surfaces of the shutters 31, 32 facing the semiconductor substrate is reflected back to the edge regions of the semiconductor substrate. This means that the radiation emitted by the edge of the wafer cools the edge of the wafer during the cooling procedure with approximately the same cooling rate as the center of the wafer. Consequently, during the cooling phase the edge of the wafer has approximately the same temperature as the center of the wafer. Therefore, the undesired effect of a wafer edge being colder than the wafer center which generally occurs during cooling procedures can be avoided by using a shutter disposed between the heating elements and the substrate retaining region and having a reflective surface facing the substrate retaining region.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An apparatus for thermally treating a substrate, the substrate defining a central region, an outer region, and an outer contour, the apparatus comprising:
    a pair of first substantially planar walls in spaced parallel relation and arranged substantially parallel to the substrate and a second wall connected to the first substantially planar walls, the pair of first substantially planar walls and second wall defining a processing space;
    a substrate holding device located within the processing space, the substrate holding device defining a substrate retaining region;
    a heating element located in the processing space between one of the first substantially planar walls and the substrate retaining region;
    a shutter located between the substrate retaining region and the heating element, the shutter configured to limit radiation emitted by the heating element in the direction of the substrate retaining region, the shutter comprising an aperture having a contour that corresponds to the outer contour of the substrate, the shutter further comprising a chamfer facing the substrate retaining region;
    wherein the second wall comprises a wall section located between the substrate retaining region and the shutter, the wall section having a reflective surface facing the substrate retaining region, the reflective surface configured to reflect radiation emitted by the substrate.

2. The apparatus of claim 1, wherein the shutter is connected to the second wall and projects from the second wall into the processing space.

3. The apparatus of claim 1, wherein the apparatus further comprises a second shutter.

4. The apparatus of claim 1, wherein the shutter comprises a round aperture.

5. The apparatus of claim 1, wherein the shutter has a reflective surface facing the substrate retaining region, the reflective surface configured to reflect radiation emitted from the outer region of the substrate back to the outer region of the substrate.

6. The apparatus of claim 1, wherein the shutter is impermeable to radiation emitted by the heating element.

7. The apparatus of claim 1, wherein the processing space defines a circumferential processing region extending between the shutter and the substrate retaining region, wherein the circumferential processing region is shielded from radiation emitted from the heating element.

8. The apparatus of claim 1, wherein the wall section is at least partially shielded from radiation emitted from the heating element.

9. The apparatus of claim 1, wherein the shutter has a circumferential reflective surface facing the substrate retaining region.

10. The apparatus of claim 9, wherein the circumferential reflective surface comprises diffuse reflection characteristics for radiation having wavelengths from 500 nm to 3000 nm.

11. The apparatus of claim 1, wherein the pair of opposing first substantially planar walls and the second wall comprise a reflective layer which diffusely reflects radiation having wavelengths from 500 nm to 3000 nm.

12. The apparatus of claim 1, wherein the shutter is formed from aluminum.

13. The apparatus of claim 1, wherein the heating element is a halogen lamp or an arc lamp.

14. The apparatus of claim 13, wherein the heating element is a rod lamp arranged substantially parallel to the first substantially planar walls.

15. The apparatus of claim 1, wherein the apparatus comprises heating elements located above the substrate retaining region and below the substrate retaining region.

16. The apparatus of claim 1, wherein the substrate holding device is rotatable in the processing space.

17. The apparatus of claim 1, wherein the wall section surrounds the substrate in at least a partially circular manner.

18. The apparatus of claim 1, wherein the wall section comprises a cross-sectional surface having an outer contour that is substantially parallel to an outer contour of the substrate.

19. The apparatus of claim 1, wherein the distance between the substrate and the wall section is 70% to 130% of the distance between the substrate and one of the first substantially planar walls.

20. The apparatus of claim 1, wherein the shutter is movable so that the distance between the shutter and the substrate retaining region is adjustable.

21. The apparatus of claim 1, wherein the shutter comprises a cooling system.

22. The apparatus of claim 1, wherein the apparatus further comprises a quartz plate located between the substrate retaining region and the heating element.

* * * * *